US012328857B2

(12) United States Patent
Komatsu et al.

(10) Patent No.: US 12,328,857 B2
(45) Date of Patent: Jun. 10, 2025

(54) ELECTRONIC COMPONENT MODULE AND METHOD OF MANUFACTURING ELECTRONIC COMPONENT MODULE

(71) Applicant: Murata Manufacturing Co., Ltd., Nagaokakyo (JP)

(72) Inventors: Toru Komatsu, Nagaokakyo (JP); Motohiko Kusunoki, Nagaokakyo (JP); Tadashi Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 216 days.

(21) Appl. No.: 18/185,621

(22) Filed: Mar. 17, 2023

(65) Prior Publication Data
US 2023/0225092 A1 Jul. 13, 2023

Related U.S. Application Data

(63) Continuation of application No. PCT/JP2021/034369, filed on Sep. 17, 2021.

(30) Foreign Application Priority Data

Sep. 24, 2020 (JP) ................................ 2020-159899

(51) Int. Cl.
*H05K 9/00* (2006.01)
*H05K 1/18* (2006.01)
(Continued)

(52) U.S. Cl.
CPC ............ *H05K 9/003* (2013.01); *H05K 1/186* (2013.01); *H05K 3/284* (2013.01); *H05K 3/3442* (2013.01);
(Continued)

(58) Field of Classification Search
CPC .. H05K 1/14; H05K 1/18; H05K 3/00; H05K 3/28; H05K 9/00; H01L 21/56;
(Continued)

(56) References Cited

U.S. PATENT DOCUMENTS 6,603,154 B2* 8/2003 Sakai .................. H01L 23/4334
257/E23.125
9,691,710 B1* 6/2017 Deng ...................... H01L 25/16
(Continued)

FOREIGN PATENT DOCUMENTS

JP H08-64403 A 3/1996
JP 2001-244688 A 9/2001
(Continued)

OTHER PUBLICATIONS

International Search Report for PCT/JP2021/034369 dated Nov. 9, 2021.

*Primary Examiner* — Tuan T Dinh
(74) *Attorney, Agent, or Firm* — McDonald Hopkins LLC

(57) ABSTRACT

An electronic component module includes a substrate having a main surface, an electronic component mounted on the main surface, a sealing resin having an insulation property and covering the electronic component and the main surface, and a conductive film that covers an outer surface of the sealing resin. The electronic component includes a housing whose outer surface has an insulation property, and a first external electrode arranged at one end of the housing. The electronic component module includes a conductive auxiliary layer that covers a part of the first external electrode and a part of the housing on a side of the electronic component opposite to the substrate. The sealing resin has a recessed portion that exposes the conductive auxiliary layer. A con-
(Continued)

ductive portion is formed in the recessed portion and is connected to the conductive film and the conductive auxiliary layer.

16 Claims, 9 Drawing Sheets

(51) Int. Cl.
 *H05K 3/28* (2006.01)
 *H05K 3/34* (2006.01)
(52) U.S. Cl.
 CPC .............. *H05K 2201/10022* (2013.01); *H05K 2201/1003* (2013.01); *H05K 2201/1006* (2013.01); *H05K 2201/10098* (2013.01); *H05K 2201/10636* (2013.01); *H05K 2203/1469* (2013.01)
(58) Field of Classification Search
 CPC ... H01L 21/561; H01L 21/565; H01L 23/498; H01L 23/552; H01L 23/3121; H01L 23/3142; H01L 23/315; H01L 23/66
 USPC .............. 361/760, 784, 794–795, 816, 818; 174/520; 257/660–690
 See application file for complete search history.

(56) References Cited

U.S. PATENT DOCUMENTS

| | | | | |
|---|---|---|---|---|
| 2008/0315396 | A1* | 12/2008 | Kuhlman | H05K 1/185 |
| | | | | 257/692 |
| 2011/0013349 | A1* | 1/2011 | Morikita | H01L 23/552 |
| | | | | 361/728 |
| 2013/0307128 | A1* | 11/2013 | Lin | H01L 23/552 |
| | | | | 257/659 |
| 2017/0243833 | A1* | 8/2017 | Choi | H01L 21/565 |
| 2019/0307028 | A1 | 10/2019 | Yazaki | |
| 2019/0341329 | A1* | 11/2019 | Yamamoto | H05K 3/28 |
| 2019/0363031 | A1 | 11/2019 | Kamada | |
| 2020/0058599 | A1* | 2/2020 | Okada | H01L 21/561 |
| 2021/0043583 | A1 | 2/2021 | Nomura et al. | |

FOREIGN PATENT DOCUMENTS

| | | |
|---|---|---|
| JP | 5321592 B2 | 10/2013 |
| WO | 2019/049493 A1 | 3/2019 |
| WO | 2019/049592 A1 | 3/2019 |
| WO | 2019/216299 A1 | 11/2019 |

* cited by examiner

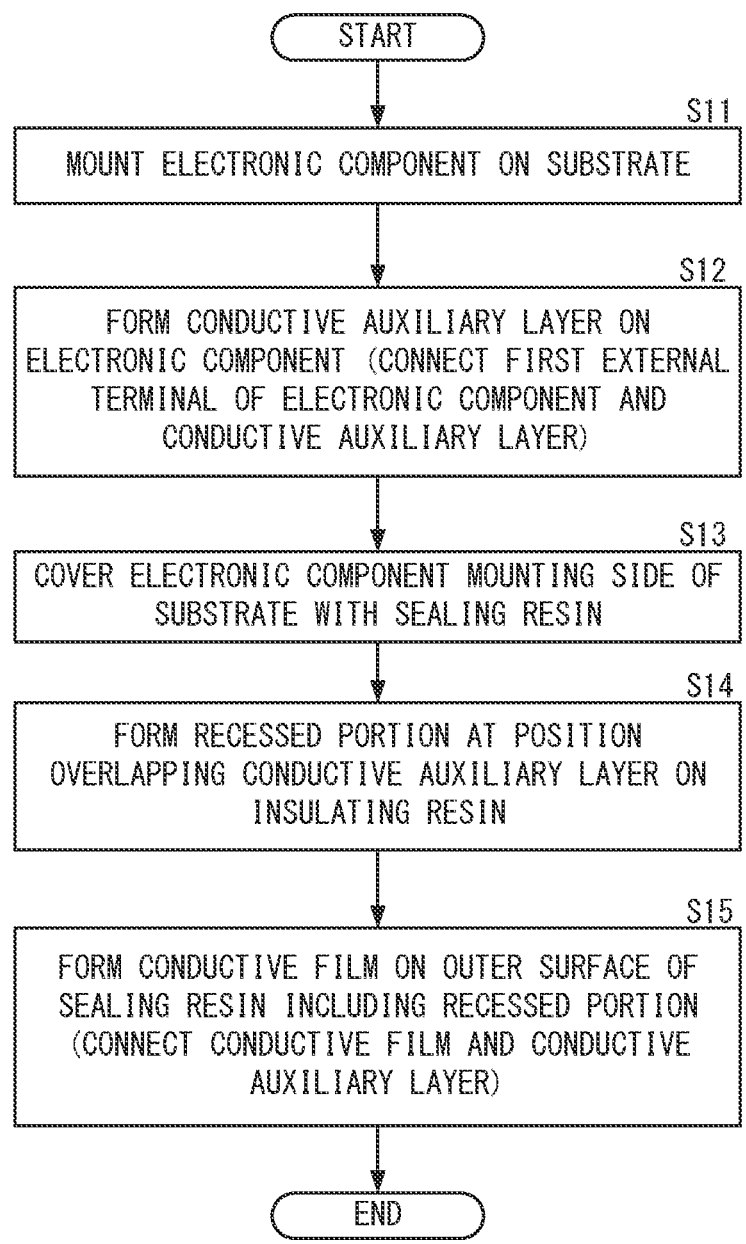

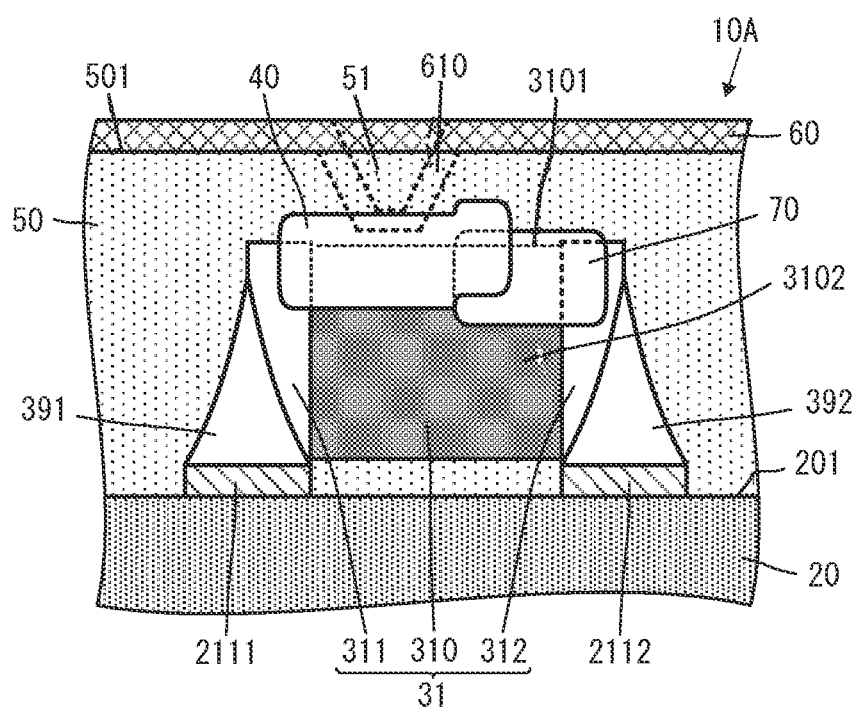
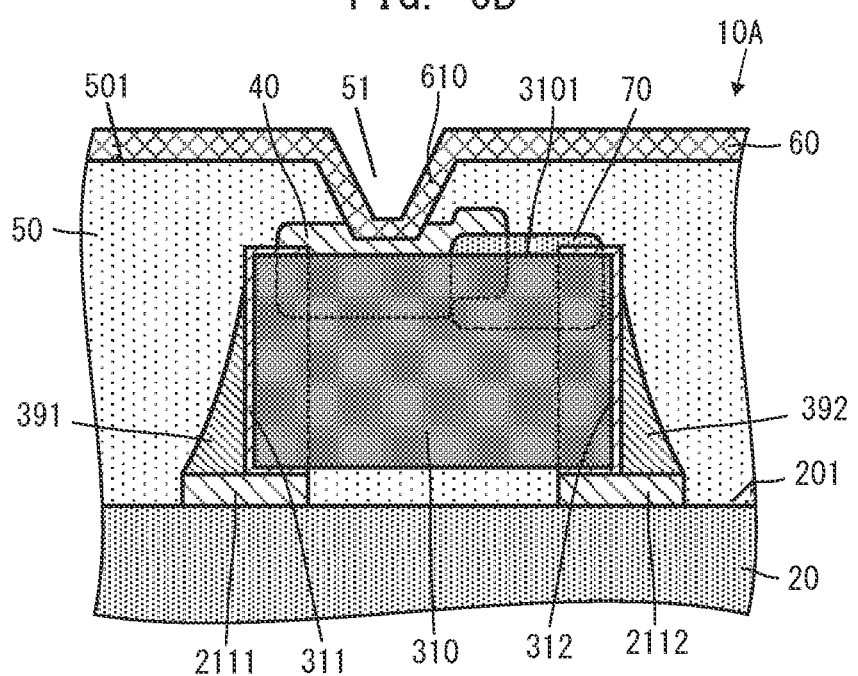

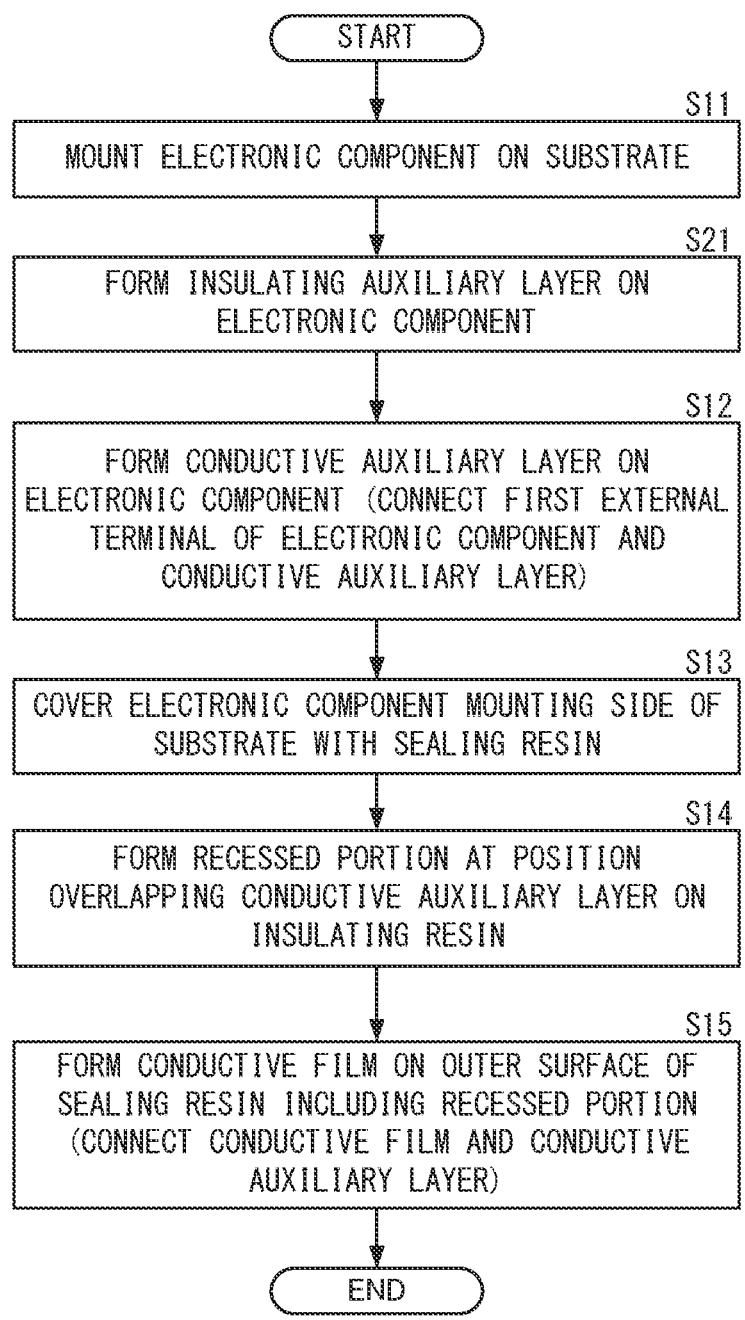

ELECTRONIC COMPONENT MODULE AND METHOD OF MANUFACTURING ELECTRONIC COMPONENT MODULE

CROSS REFERENCE TO RELATED APPLICATION

This is a continuation of International Application No. PCT/JP2021/034369 filed on Sep. 17, 2021 which claims priority from Japanese Patent Application No. 2020-159899 filed on Sep. 24, 2020. The contents of these applications are incorporated herein by reference in their entireties.

BACKGROUND OF THE DISCLOSURE

Field of the Disclosure

The present disclosure relates to an electronic component module including a plurality of electronic components mounted on a substrate and having an electromagnetic shield structure.

Description of the Related Art

Patent Literature 1 recites an electronic component module. The electronic component module recited in Patent Literature 1 includes a circuit board, a surface mounting component, a sealing resin, a conductive thin film, and a conductive post.

The surface mounting component is mounted on a circuit board. The sealing resin covers a mounting surface of the surface mounting component on the circuit board and the surface mounting component. The conductive thin film covers an outer surface of the sealing resin.

The conductive post is formed on a top surface of an external electrode of the surface mounting component. The conductive post penetrates the sealing resin on the top surface side of the surface mounting component to connect the external electrode and the conductive thin film. As a result, the external electrode of the surface mounting component is electrically conducted to the conductive thin film.

The conductive post is formed by filling a hole provided in the sealing resin with a conductive paste and curing the conductive paste. The conductive paste contains a conductive component and a synthetic resin.

Patent Literature 1
Japanese Patent No. 5321592

BRIEF SUMMARY OF THE DISCLOSURE

The conductive post, however, has a higher resistivity than a conductive post not containing a binder such as a synthetic resin. In addition, as the surface mounting component becomes smaller, the external electrode becomes smaller, and a cross-sectional area of the conductive post also becomes smaller. This further increases the resistivity of the conductive post.

Therefore, a possible benefit of the present disclosure is to provide an electronic component module enabling a surface mounting component embedded in a sealing resin to be connected to a conductive film on an outer surface of the sealing resin with lower resistance.

An electronic component module according to the present disclosure includes a substrate having a first main surface, an electronic component mounted on the first main surface of the substrate, a sealing resin having an insulation property and covering the electronic component and the first main surface side of the substrate, and a conductive film covering an outer surface of the sealing resin. The electronic component includes a housing whose outer surface has an insulation property, at least a first external electrode arranged on the outer surface of the housing, and a second external electrode. The electronic component module includes a conductive auxiliary layer that is provided on a side of the electronic component opposite to the substrate in a normal direction of the first main surface, and covers a part of the first external electrode and is not connected to the second external electrode. The sealing resin has a recessed portion that exposes the conductive auxiliary layer. The conductive film is formed in the recessed portion and is connected to the conductive auxiliary layer.

In this configuration, a connection distance between the first external electrode and the conductive film is shortened, so that the first external electrode and the conductive film are connected with lower resistance.

According to the present disclosure, the surface mounting component embedded in the sealing resin and the conductive film on the outer surface of the sealing resin can be connected with lower resistance.

BRIEF DESCRIPTION OF THE SEVERAL VIEWS OF THE DRAWINGS

FIG. 4 is a flowchart illustrating an example of a method of manufacturing the electronic component module 10 according to the first embodiment.

FIG. 6A is an enlarged side cross-sectional view of a part of an electronic component module 10A according to the second embodiment, the part having the conductive auxiliary layer 40, and FIG. 6B is a side sectional view of another part of the section shown in FIG. 6A.

FIG. 7 is a flowchart illustrating an example of a method of manufacturing the electronic component module 10A according to the second embodiment.

DETAILED DESCRIPTION OF THE DISCLOSURE

First Embodiment

Figure 1A:
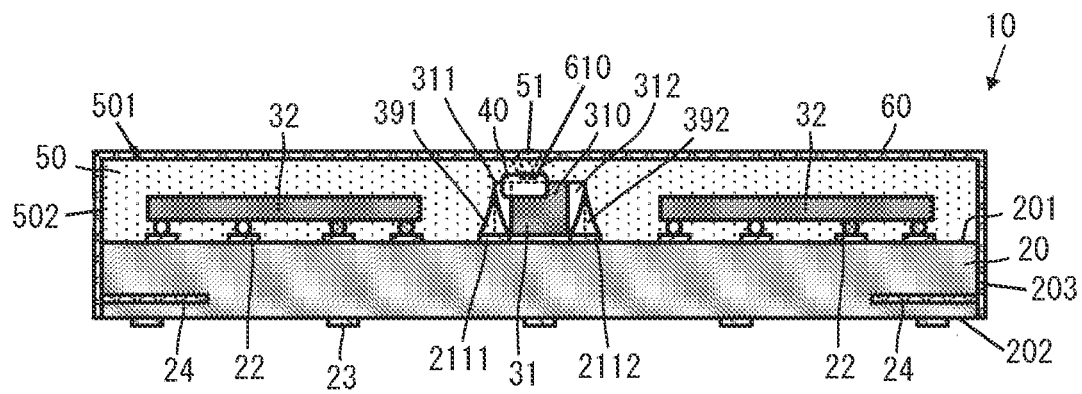
FIG. 1A is a side cross-sectional view illustrating an electronic component module 10 according to a first embodiment.
Figure 1B:
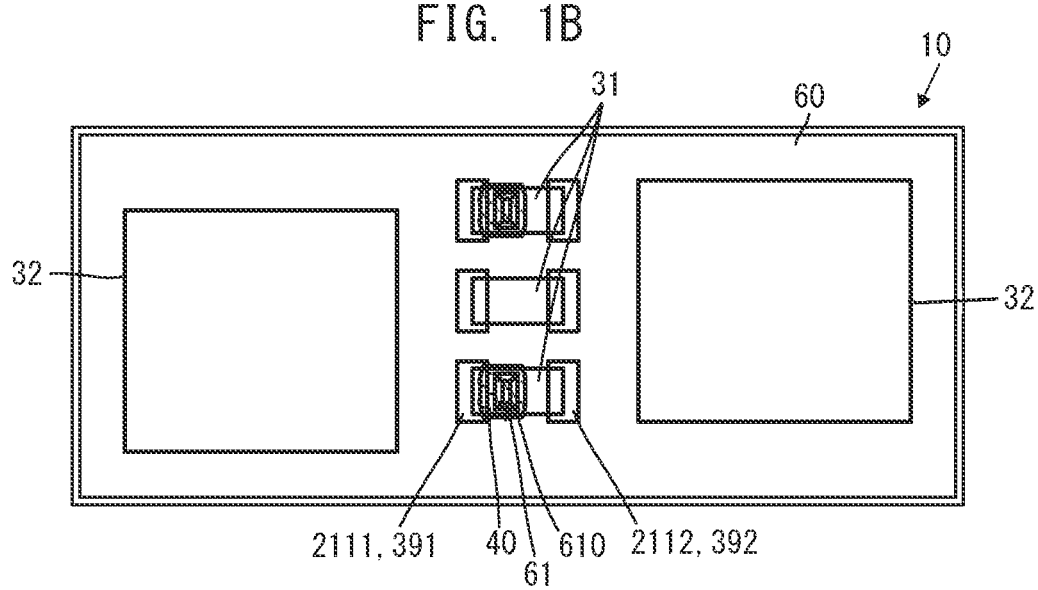
FIGS. 1B and 1C are plan views of the electronic component module 10 according to the first embodiment.
Figure 1C:
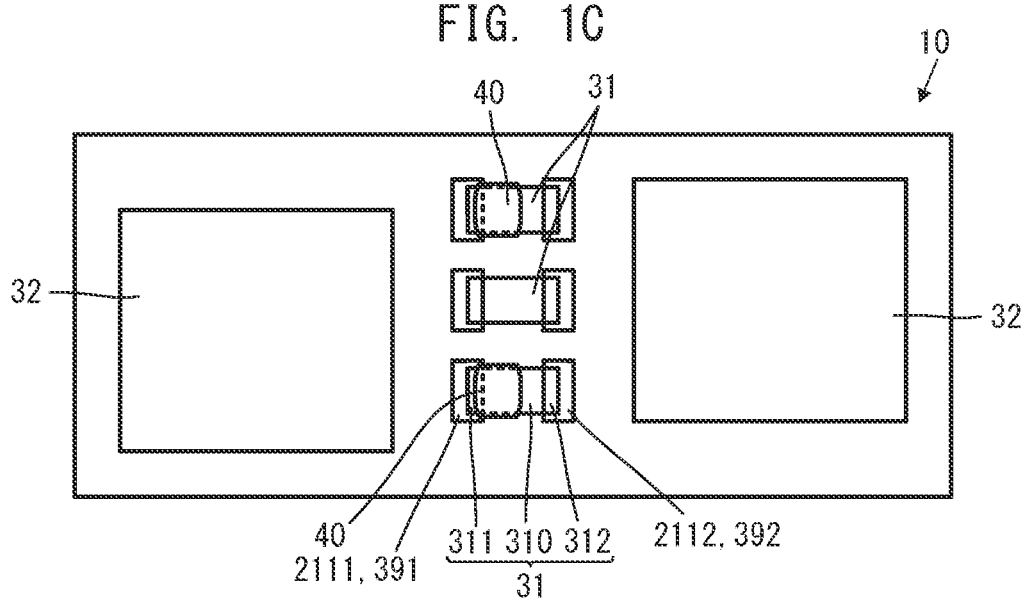
Figure 2A:
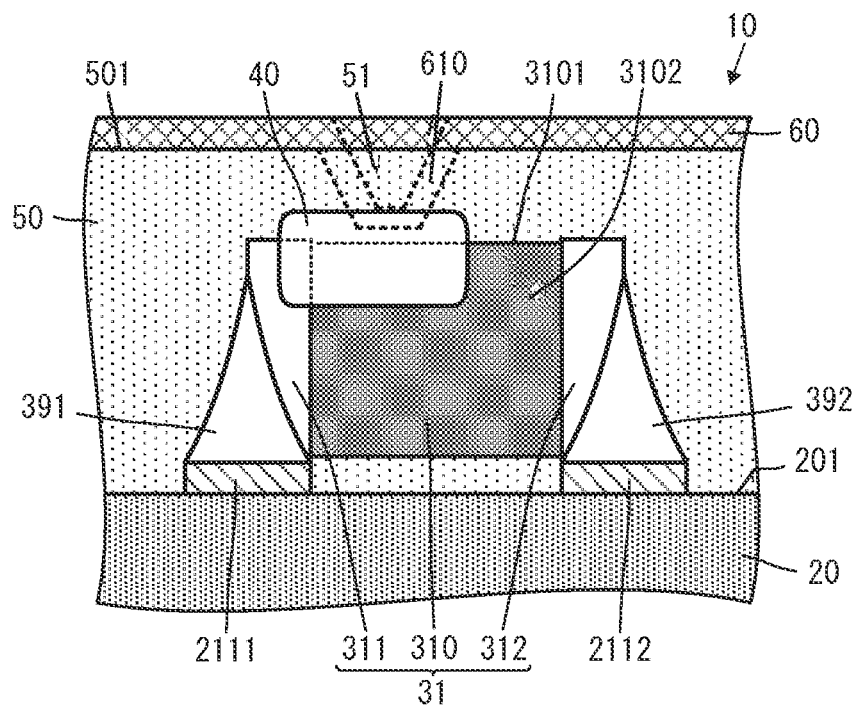
FIG. 2A is an enlarged side cross-sectional view of a part of the electronic component module 10 according to the first embodiment, the part having a conductive auxiliary layer 40.
Figure 2B:
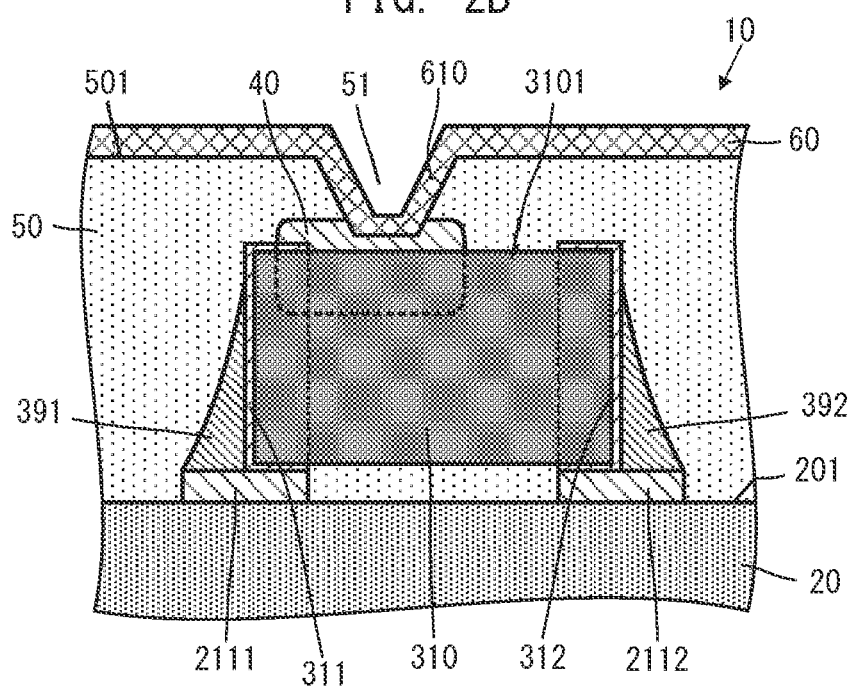
FIG. 2B is a side cross-sectional view of another part of the section illustrated in FIG. 2A.
Figure 3:
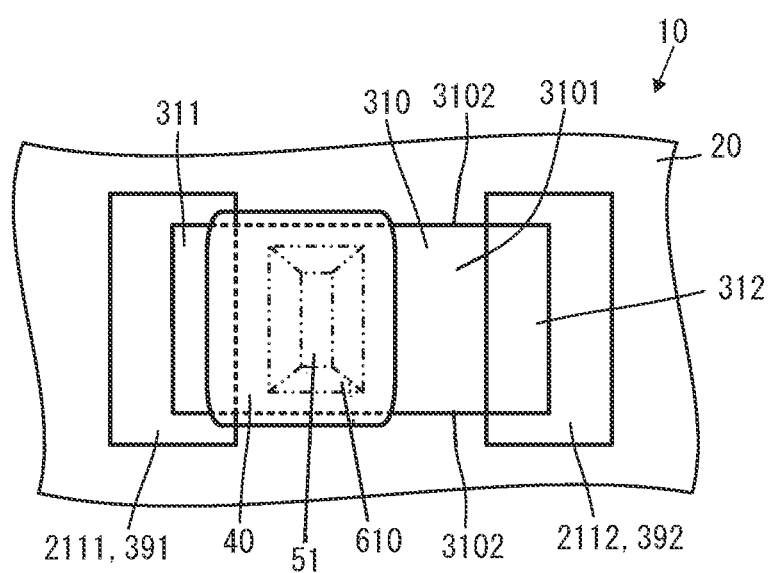
FIG. 3 is an enlarged plan view of a part of the electronic component module 10 according to the first embodiment, the part having the conductive auxiliary layer 40.

An electronic component module according to a first embodiment of the present disclosure will be described with reference to the drawings. FIG. 1A is a side cross-sectional view of an electronic component module 10 according to the first embodiment. Note that FIG. 1A is not a cross-sectional view of the electronic component module 10 taken along one straight line, but illustrates a configuration of the electronic component module 10 to facilitate understanding thereof. FIGS. 1B and 1C are plan views of the electronic component module 10 according to the first embodiment. FIG. 1B shows a state in which a conductive film 60 and a sealing resin 50 are provided, and FIG. 1C shows a state in which the conductive film 60 and the sealing resin 50 are not provided. Note that FIG. 1B is a perspective view of the conductive film 60. FIG. 2A is an enlarged side cross-sectional view of a part of the electronic component module 10 according to the first embodiment, the part having a conductive auxiliary layer 40. FIG. 2B is a side cross-sectional view of another part of the section illustrated in FIG. 2A. FIG. 3 is an enlarged plan view of a part of the electronic component module 10 according to the first embodiment, the part having the conductive auxiliary layer 40. FIG. 3 shows a state in which the conductive film 60 and the sealing resin 50 are not provided.

As illustrated in FIGS. 1A, 1B, and 1C, the electronic component module 10 includes a substrate 20, an electronic component 31, an electronic component 32, the conductive auxiliary layer 40, the sealing resin 50, and the conductive film 60.

The substrate 20 has a core having an insulation property and has a conductor pattern for realizing the electronic component module 10. The substrate 20 is configured by, for example, a stack of a plurality of insulator layers having a predetermined conductor pattern formed. The conductor pattern includes, for example, a grounding conductor pattern 24 as illustrated in FIG. 1A.

The substrate 20 is, for example, a rectangular flat plate, and has a main surface 201 and a main surface 202 opposed to each other. The substrate 20 is formed by a ceramic multilayer substrate or a resin multilayer substrate.

A plurality of land electrodes for mounting electronic components are formed on the main surface 201 of the substrate 20. The plurality of land electrodes include a land electrode 2111 and a land electrode 2112 for the electronic component 31, and a land electrode 22 for the electronic component 32.

A terminal electrode 23 for external connection is formed on the main surface 202 of the substrate 20. A predetermined number of terminal electrodes 23 for external connection are formed according to specifications of the electronic component module 10.

The electronic component 31 includes a housing 310, a first external electrode 311, and a second external electrode 312. The housing 310 has a rectangular shape, whose outer surface (top surface, bottom surface, side surface) excluding both end surfaces has an insulation property. The first external electrode 311 is formed at one end of the housing 310. The second external electrode 312 is formed at the other end of the housing 310. The first external electrode 311 and the second external electrode 312 have shapes reaching a top surface 3101 (see FIG. 2A), a bottom surface, and a side surface 3102 of the housing 310 (see FIG. 2A).

The electronic component 31 is mounted on the main surface 201 of the substrate 20. More specifically, the first external electrode 311 of the electronic component 31 is bonded to the land electrode 2111 using a conductive bonding material 391 such as solder. The second external electrode 312 of the electronic component 31 is bonded to the land electrode 2112 using a conductive bonding material 392 such as solder. The bonded surface that is opposed to the substrate 20 is a bottom surface of the electronic component 31. A surface (a surface of the electronic component 31 opposite to the substrate 20 side) opposed to the bottom surface is the top surface 3101 of the electronic component 31. Surfaces orthogonal to the top surface and the bottom surface are the side surfaces 3102 of the electronic component 31. Note that the electronic component 31 may be any electronic component having a part of the external electrode existing on the top surface side, and for example, a chip inductor, a chip resistor, an LC filter element, a balun element, a coupler element, a matching device element, or the like can be used.

The electronic component 32 has a core and a solder bump. The electronic component 32 is mounted on the main surface 201 of the substrate 20. More specifically, the electronic component 32 is bonded to the land electrode 22 by the solder bump.

The conductive auxiliary layer 40 is formed in the top surface 3101 of the electronic component 31. The conductive auxiliary layer 40 overlaps at least a part of the first external electrode 311 and is connected (conducted) to the first external electrode 311. In addition, the conductive auxiliary layer 40 overlaps a part of the housing 310 on the first external electrode 311 side. The conductive auxiliary layer 40 is not connected to the second external electrode 312.

The conductive auxiliary layer 40 is formed so as to go around the side surface 3102 from the top surface 3101. Thus, the conductive auxiliary layer 40 is formed to be wider than the first external electrode 311 and the housing 310. The conductive auxiliary layer 40 may be formed only in the top surface 3101. Further, the conductive auxiliary layer 40 may be formed so as to overlap only the first external electrode 311.

A thickness of the conductive auxiliary layer 40 need only be smaller than a distance between the top surface 3101 of the electronic component 31 and the conductive film 60 opposed to the top surface 3101 of the electronic component 31. Furthermore, the thickness of the conductive auxiliary layer 40 is preferably thin.

The conductive auxiliary layer 40 is formed, for example, by curing a conductive paste. The conductive paste contains conductive particles made of metal such as copper, silver, or the like, and a resin binder having an insulation property.

The sealing resin 50 covers the main surface 201 side of the substrate 20. The sealing resin 50 covers the electronic component 31 on which the conductive auxiliary layer 40 is formed and the electronic component 32. The sealing resin 50 is made of an insulating resin.

The sealing resin 50 has a recessed portion 51. The recessed portion 51 has a shape recessed from a top surface 501 of the sealing resin 50. In plan view of the substrate 20 (viewed in a direction orthogonal to the main surface 201), the recessed portion 51 is formed at a position overlapping the conductive auxiliary layer 40. The recessed portion 51 is formed so as to expose the conductive auxiliary layer 40. At this time, the recessed portion 51 preferably has a depth that allows the conductive auxiliary layer 40 to be recessed, and preferably has a depth that does not reach the top surface 3101 of the housing 310 of the electronic component 31. In other words, the conductive auxiliary layer 40 covers an outer edge of a side surface of the recessed portion 51.

The conductive film 60 covers the outer surface (the top surface 501 and side surfaces 502) of the sealing resin 50 and side surfaces 203 of the substrate 20. The conductive film 60 is connected to the grounding conductor pattern 24 of the substrate 20.

The conductive film 60 is also formed on a wall surface of the recessed portion 51, and this portion forms a conductive portion 610. When the recessed portion 51 reaches the conductive auxiliary layer 40, the conductive portion 610 is connected (conducted) to the conductive auxiliary layer 40.

The conductive film 60 is a metal film formed by, for example, sputtering, plating, or the like. The conductive film 60 has a conductivity higher than that of the conductive auxiliary layer 40. The conductive film 60 has a configuration in which, for example, an adhesion layer, a conductive layer, and an antirust layer are stacked. The adhesion layer is provided to enhance adhesion between the sealing resin 50 and the conductive layer, and is made of, for example, stainless steel (SUS) or the like. The conductive layer has a function of shielding electromagnetic waves, and is made of, for example, copper (Cu), silver (Ag), aluminum (Al), or the like. The antirust layer is provided to protect the conductive layer from corrosion, damage, and the like, and is made of, for example, stainless steel (SUS) or the like.

With such a configuration, the first external electrode 311 of the electronic component 31 is connected to the conductive portion 610 of the conductive film 60 via the conductive auxiliary layer 40. Since the conductive auxiliary layer 40 is thin, the first external electrode 311 and a portion of the conductive film 60 formed in the top surface 501 of the sealing resin 50 are connected mainly by the conductive portion 610.

The conductive portion 610 is a film having a high conductivity, and has lower resistance than the conductive auxiliary layer 40 containing an insulating binder and a conductive post having a conventional configuration. Accordingly, the first external electrode 311 and the portion of the conductive film 60 formed in the top surface 501 of the sealing resin 50 are connected with low resistance. As described above, in a mode in which the conductive film 60 is connected to the grounding conductor pattern 24, the above arrangement enables an electromagnetic shield portion having a high shielding effect to be formed on the top surface 3101 side of the electronic component 31. As a result, for example, electromagnetic interference between the plurality of electronic components 32 arranged with the electronic component 31 interposed therebetween can be effectively suppressed.

Further, in this configuration, since the conductive auxiliary layer 40 has a shape overlapping the housing 310, a shape of the recessed portion 51 (a shape of the conductive portion 610) is not subjected to constraints of an area of the top surface of the first external electrode 311. In other words, the shape of the recessed portion 51 (the shape of the conductive portion 610) can be larger than the area of the top surface of the first external electrode 311. As a result, the resistance of the conductive portion 610 can be further reduced.

In addition, this configuration facilitates formation of the recessed portion 51, i.e., formation of the conductive portion 610. Accordingly, it is possible to increase an allowable range of positional variation of the recessed portion 51 at the time of forming the recessed portion 51 (e.g., at the time of laser processing to be described later). This enables the first external electrode 311 and the conductive film 60 to be connected more reliably. In addition, since the conductive auxiliary layer 40 is wide as in the above-described configuration, the allowable range of variation can be further increased.

In this configuration, the recessed portion 51 overlaps the housing 310 and does not overlap the first external electrode 311. In other words, the recessed portion 51 is not astride a boundary between the housing 310 and the first external electrode 311 in plan view of the electronic component 31. This allows the recessed portion 51 to be formed at a wider flat face, which more facilitates formation of the recessed portion 51. The formation position of the recessed portion 51 is not limited to the above unless it deviates from a formation region of the conductive auxiliary layer 40. For example, the recessed portion 51 may be formed to be astride the boundary between the housing 310 and the first external electrode 311. In this case, the formation of the recessed portion 51 is further facilitated.

In addition, in this configuration, the recessed portion 51 is formed to a depth at which the conductive auxiliary layer 40 is recessed. As a result, not only a bottom surface but also a part of a side surface of the conductive portion 610 is connected to the conductive auxiliary layer 40. Therefore, connection reliability between the conductive portion 610 and the conductive auxiliary layer 40 is improved to realize further low resistance.

In plan view of the substrate, the conductive auxiliary layer 40 is formed so as not to overlap the conductive bonding material 391. However, the conductive auxiliary layer 40 can also be formed so as to overlap the conductive bonding material 391. Note that by making the conductive auxiliary layer 40 not to overlap the conductive bonding material 391, i.e., a solder fillet whose height gradually changes, the conductive auxiliary layer 40 having a uniform thickness and a flat shape can be easily formed.

(Method of Manufacturing Electronic Component Module According to First Embodiment)

FIG. 4 is a flowchart illustrating an example of a method of manufacturing the electronic component module 10 according to the first embodiment. FIGS. 5A, 5B, 5C, 5D, and 5E are views showing a state of a manufacturing process of the electronic component module 10 according to the first embodiment. FIGS. 5A to 5E are enlarged views of a part of the electronic component on which the conductive auxiliary layer 40 is formed. Note that since the structural features have been described above, description of the structural features will be omitted below.

Figure 5A:
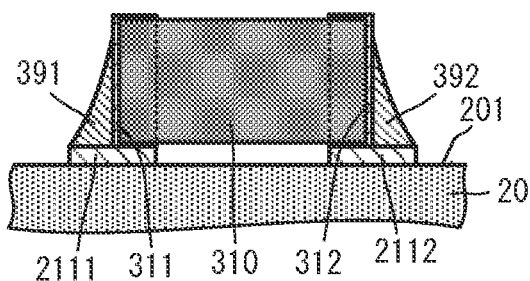
FIGS. 5A, 5B, 5C, 5D, and 5E are views showing a state of a manufacturing process of the electronic component module 10 according to the first embodiment.

As shown in FIG. 5A, the electronic component 31 and the electronic component 32 are mounted on the substrate 20 (S11).

Figure 5B:
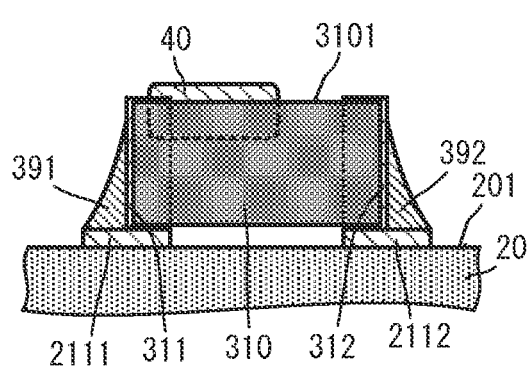

As shown in FIG. 5B, the conductive auxiliary layer 40 is formed in the surface (top surface) of the first external electrode 311 of the electronic component 31 opposite to the substrate 20 side (S12). More specifically, a conductive paste is applied to the first external electrode 311 of the electronic component 31 and to the top surface 3101 of the housing 310, and cured. Although the thickness of the conductive auxiliary layer 40 is, for example, about 30 [μm], it is not limited thereto.

Figure 5C:
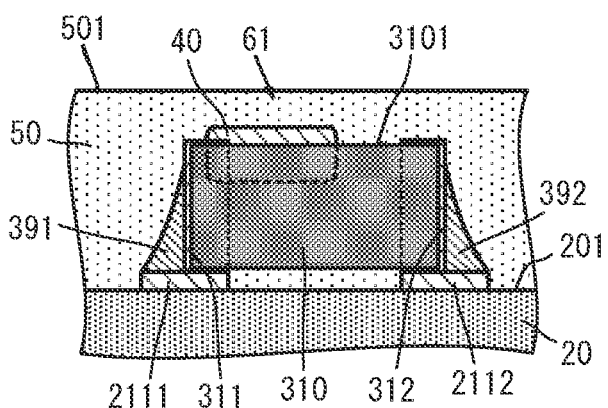

As shown in FIG. 5C, a mounting surface side of the electronic component 31 and the electronic component 32 on the substrate 20 is covered with the sealing resin 50 having an insulation property (S13). More specifically, the insulating resin is applied on the main surface 201 side of the substrate 20 and cured.

Figure 5D:
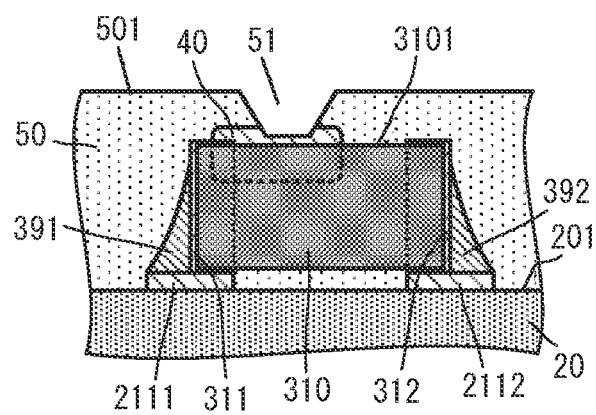

As shown in FIG. 5D, the recessed portion 51 that exposes the conductive auxiliary layer 40 from the sealing resin 50 is formed (S14). More specifically, the sealing resin 50 is ground by irradiating a region where the conductive auxiliary layer 40 is formed with a laser light from the top surface 501 side of the sealing resin 50. Although the laser light preferably has a wavelength of, for example, 532 [nm] or less, the wavelength is not limited thereto.

Figure 5E:
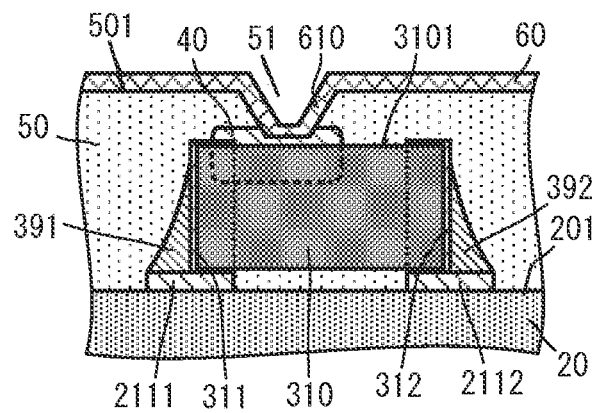

As shown in FIG. 5E, the conductive film 60 is formed on the sealing resin 50 including the recessed portion 51 (S15). The conductive film 60 has a three-layered configuration in which, for example, an adhesion layer, a conductive layer, and an antirust layer are stacked. The conductive film 60 is formed by sequential sputtering or the like of the adhesion layer, the conductive layer, and the antirust layer.

By using such manufacturing method, the electronic component module 10 having excellent electromagnetic shielding properties can be easily and more reliably formed.

Second Embodiment

An electronic component module according to a second embodiment of the present disclosure will be described with reference to the drawings. FIG. 6A is an enlarged side cross-sectional view of a part of an electronic component module 10A according to the second embodiment, the part having the conductive auxiliary layer 40. FIG. 6B is a side cross-sectional view of another part of the section illustrated in FIG. 6A.

As illustrated in FIGS. 6A and 6B, the electronic component module 10A according to the second embodiment is different from the electronic component module 10 according to the first embodiment in including an insulating auxiliary layer 70. The remaining configuration of the electronic component module 10A is the same as that of the electronic component module 10, and description of the same parts will be omitted.

The electronic component module 10A includes the insulating auxiliary layer 70. The insulating auxiliary layer 70 is formed in the top surface 3101 of the electronic component 31. In plan view of the substrate, the insulating auxiliary layer 70 overlaps at least a part of the second external electrode 312. The insulating auxiliary layer 70 overlaps a part of the housing 310 on the second external electrode 312 side. The insulating auxiliary layer 70 does not overlap the first external electrode 311.

The insulating auxiliary layer 70 is formed so as to go around the side surface 3102 from the top surface 3101. At this time, a length of the insulating auxiliary layer 70 going around the side surface 3102 is larger than that of the conductive auxiliary layer 40.

The conductive auxiliary layer 40 is arranged on the surface of the insulating auxiliary layer 70 opposite to the housing 310 side so as to overlap the insulating auxiliary layer 70.

With such configuration, a short circuit between the conductive auxiliary layer 40 and the second external electrode 312 is suppressed by the insulating auxiliary layer 70. In addition, as described above, the insulating auxiliary layer 70 is formed down to the side surface 3102, and spreads more largely in a downward direction of the side surface 3102 than the conductive auxiliary layer 40. Thus, a short circuit between the conductive auxiliary layer 40 and the second external electrode 312 on the side surface 3102 is more reliably suppressed.

Further, in this configuration, an area of the conductive auxiliary layer 40 as viewed from the top surface can be increased. As a result, the recessed portion 51 more reliably overlaps the conductive auxiliary layer 40. Accordingly, the conductive portion 610 is more reliably connected to the conductive auxiliary layer 40, and eventually, the conductive film 60 and the conductive auxiliary layer 40 are more reliably connected.

In this configuration, the shape of the recessed portion 51 can be enlarged. As a result, an area of the conductive portion 610 can be increased, and a connection resistance between the conductive auxiliary layer 40 and the conductive film 60 can be further reduced.

In the configurations shown in FIGS. 6A and 6B, the recessed portion 51 and the insulating auxiliary layer 70 do not overlap. This makes a height of the conductive auxiliary layer 40 at the formation position of the recessed portion 51 uniform. Accordingly, the recessed portion 51 can be easily and reliably formed to have a predetermined depth. The formation position of the recessed portion 51 is not limited to the above. In a case where the conductive auxiliary layer 40 has a predetermined thickness (e.g., a thickness that does not allow the recessed portion 51 to penetrate the conductive auxiliary layer 40 even if the recessed portion is formed to have a predetermined depth), the formation position of the recessed portion 51 may protrude to a region overlapping the insulating auxiliary layer 70.

(Method of Manufacturing Electronic Component Module According to Second Embodiment)

FIG. 7 is a flowchart illustrating an example of a method of manufacturing the electronic component module 10A according to the second embodiment.

As shown in FIG. 7, the method of manufacturing the electronic component module 10A according to the second embodiment is different from the method of manufacturing the electronic component module 10 according to the first embodiment in that a step of forming the insulating auxiliary layer 70 is added. The other steps of the method of manufacturing the electronic component module 10A according to the second embodiment are the same as the other steps of the electronic component module 10 according to the first embodiment, and description of the same parts is omitted.

After the electronic component 31 is mounted on the substrate 20 (S11), the insulating auxiliary layer 70 is formed on the electronic component 31 (S21). Then, after the insulating auxiliary layer 70 is formed, the conductive auxiliary layer 40 is formed (S12).

More specifically, the insulating auxiliary layer 70 is formed in a manner as follows.

An insulating resin is applied so as to cover a portion of the second external electrode 312 on the housing 310 side and a portion of the housing 310 on the second external electrode 312 side and not to cover the first external electrode 311. This insulating resin may be the same or different from the material of the sealing resin 50.

The applied insulating resin is cured. Thus, the insulating auxiliary layer 70 is formed.

By using such manufacturing method, the electronic component module 10A having excellent electromagnetic shielding properties can be easily and more reliably formed.

Third Embodiment

Figure 8A:
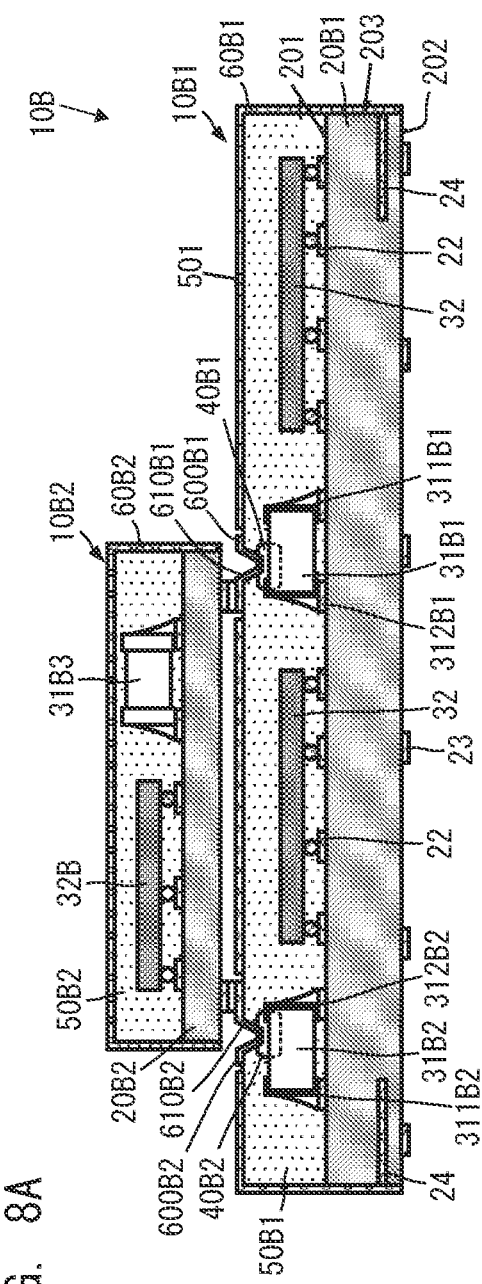
FIG. 8A is a side cross-sectional view illustrating an electronic component module 10B according to a third embodiment.
Figure 8B:
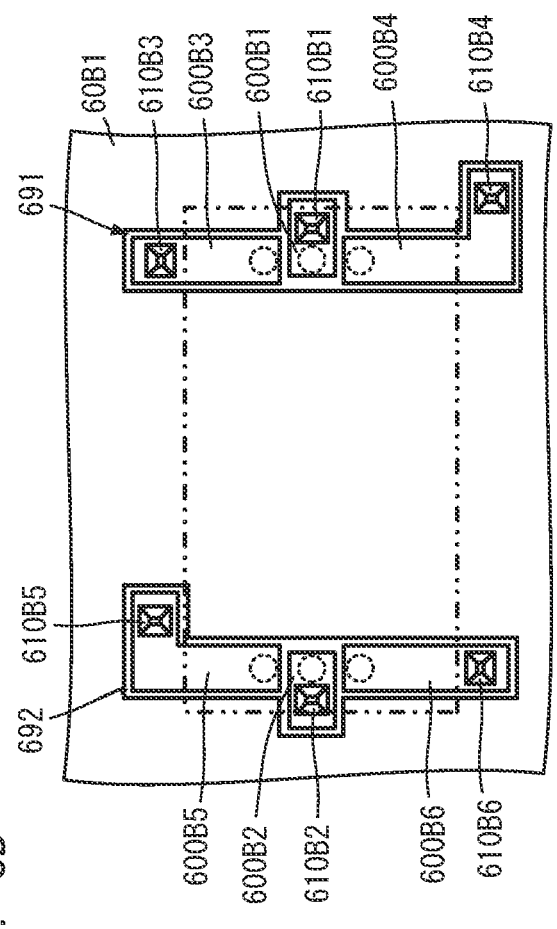
FIG. 8B is a plan views showing a predetermined conductive portion of the electronic component module 10B according to the third embodiment.

An electronic component module according to a third embodiment of the present disclosure will be described with reference to the drawings. FIG. 8A is a side cross-sectional view of an electronic component module 10B according to the third embodiment. FIG. 8B is a plan view illustrating a predetermined conductive portion of the electronic component module 10B according to the third embodiment. FIG. 8B is an enlarged view of a part where the predetermined conductive portion is formed.

As shown in FIGS. 8A and 8B, the electronic component module 10B according to the third embodiment is different in including two electronic component modules 10B1 and 10B2, including a conductive portion 610B1, a conductive portion 610B2, a conductive portion 610B3, a conductive portion 610B4, a conductive portion 610B5, and a conductive portion 610B6, including a conductor pattern 600B1, a conductor pattern 600B2, a conductor pattern 600B3, a conductor pattern 600B4, a conductor pattern 600B5, and a conductor pattern 600B6. Basic configurations of the electronic component module 10B1 and the electronic component module 10B2 are the same as those of the electronic component modules 10 and 10A according to the above-described respective embodiments, and description of the same parts is omitted.

The electronic component module 10B1 includes a substrate 20B1, an electronic component 31B1, an electronic component 31B2, the electronic component 32, a conductive auxiliary layer 40B1, a conductive auxiliary layer 40B2, a sealing resin 50B1, a conductive film 60B1, the conductor pattern 600B1, the conductor pattern 600B2, the conductor pattern 600B3, the conductor pattern 600B4, the conductor pattern 600B5, and the conductor pattern 600B6.

The electronic component 31B1, the electronic component 31B2, and the electronic component 32 are mounted on the main surface 201 of the substrate 20B1.

The conductive auxiliary layer 40B1 is arranged so as to overlap a second external electrode 312B1 and the housing of the electronic component 31B1. The conductive auxiliary layer 40B1 is not connected to a first external electrode 311B1. The conductive auxiliary layer 40B2 is arranged so as to overlap a second external electrode 312B2 and the housing of the electronic component 31B2. The conductive auxiliary layer 40B2 is not connected to a first external electrode 311B2.

The sealing resin 50B1 is formed so as to cover the main surface 201 of the substrate 20B1, the electronic component 31B1, the electronic component 31B2, and the electronic component 32.

In the sealing resin 50B1, recessed portions are formed at positions overlapping the conductive auxiliary layer 40B1 and the conductive auxiliary layer 40B2, respectively. The conductive portion 610B1 and the conductive portion 610B2 are formed in the recessed portions, respectively. The conductive portion 610B1 is connected to the conductive auxiliary layer 40B1, and the conductive portion 610B2 is connected to the conductive auxiliary layer 40B2.

The conductive film 60B1 is formed on an outer surface of the sealing resin 50B1.

The conductor pattern 600B1 and the conductor pattern 600B2 are formed on the top surface 501 of the sealing resin 50B1. The conductor pattern 600B1 and the conductor pattern 600B2 are physically separated from each other, and are physically separated from the conductive film 60B1.

The conductor pattern 600B1 is connected to the conductive portion 610B1. The conductor pattern 600B2 is connected to the conductive portion 610B2.

In the sealing resin 50B1, recessed portions are respectively formed at positions overlapping a plurality of conductive auxiliary layers (not illustrated). The conductive portion 610B3, the conductive portion 610B4, the conductive portion 610B5, and the conductive portion 610B6 are formed in the recessed portions, respectively. The conductive portion 610B3, the conductive portion 610B4, the conductive portion 610B5, and the conductive portion 610B6 are connected to their overlapping conductive auxiliary layers, respectively. Note that all the connections of the conductive portions 610 are not limited to the above. When a protruding conductive portion such as a conductor block, a conductor pin, or a post electrode is used instead of the electronic component 31, the conductive portion 610 and the protruding conductor may be directly connected without interposing the conductive auxiliary layer therebetween.

The conductor pattern 600B3, the conductor pattern 600B4, the conductor pattern 600B5, and the conductor pattern 600B6 are formed on the top surface 501 of the sealing resin 50B1. The conductor pattern 600B3, the conductor pattern 600B4, the conductor pattern 600B5, and the conductor pattern 600B6 are physically separated from each other, and are physically separated from the conductive auxiliary layer 40B1, the conductive auxiliary layer 40B2, and the conductive film 60B1.

For example, as illustrated in FIG. 8B, the conductor pattern 600B1, the conductor pattern 600B3, and the conductor pattern 600B4 are separated from the conductive film 60B1 and separated from each other by a conductor non-forming portion 691. As illustrated in FIG. 8B, the conductor pattern 600B2, the conductor pattern 600B5, and the conductor pattern 600B6 are separated from the conductive film 60B1 and separated from each other by the conductor non-forming portion 692.

The conductor pattern 600B3 is connected to the conductive portion 610B3. The conductor pattern 600B4 is connected to the conductive portion 610B4. The conductor pattern 600B5 is connected to the conductive portion 610B5. The conductor pattern 600B6 is connected to the conductive portion 610B6.

The electronic component module 10B2 includes a substrate 20B2, an electronic component 31B3, an electronic component 32B, a sealing resin 50B2, and a conductive film 60B2.

The electronic component 31B3 and the electronic component 32B are mounted on a first main surface of the substrate 20B2.

The sealing resin 50B2 is formed so as to cover the first main surface of the substrate 20B2, the electronic component 31B3, and the electronic component 32B.

The conductive film 60B2 is formed on an outer surface of the sealing resin 50B2.

The electronic component module 10B2 is mounted on a top surface side of the electronic component module 10B1. More specifically, a plurality of terminal electrodes formed on the substrate 20B2 of the electronic component module 10B2 are connected to the plurality of conductor patterns 600B1, the conductor pattern 600B2, the conductor pattern 600B3, the conductor pattern 600B4, the conductor pattern 600B5, and the conductor pattern 600B6 of the electronic component module 10B1 via a conductive bonding material such as solder. In other words, the plurality of conductor patterns 600B1, the conductor pattern 600B2, the conductor pattern 600B3, the conductor pattern 600B4, the conductor pattern 600B5, and the conductor pattern 600B6 are wiring electrodes that connect the electronic component module 10B1 and the electronic component module 10B2.

As described above, in the electronic component module 10B, the plurality of conductive portions 610B1 to 610B6 formed in the recessed portions of the sealing resin 50B1 are used as a conductor path connecting the electronic component module 10B1 and the electronic component module 10B2. This makes a connection resistance between the electronic component module 10B1 and the electronic component module 10B2 decrease. Accordingly, it is possible to realize the electronic component module 10B having suppressed losses.

Fourth Embodiment

Figure 9A:
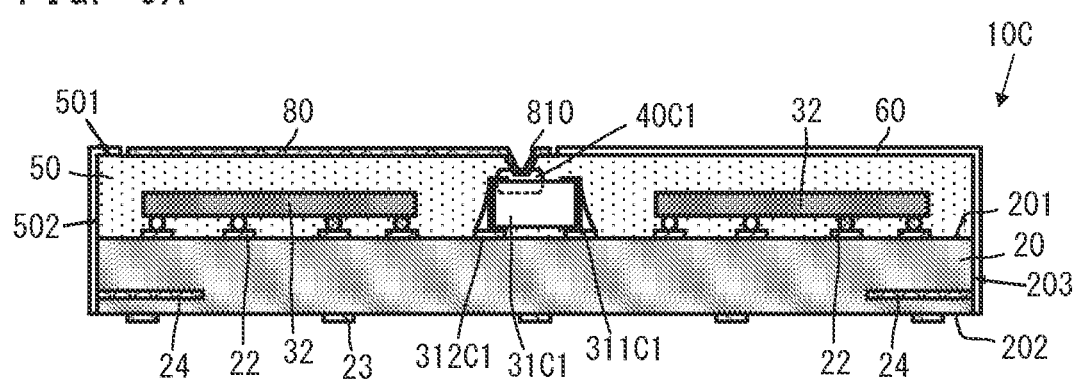
FIG. 9A is a side cross-sectional view illustrating an electronic component module 10C according to a fourth embodiment.
Figure 9B:
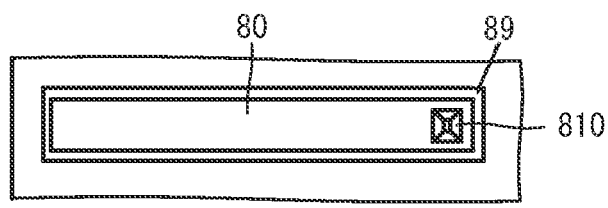
FIG. 9B is a plan views showing a predetermined conductive portion of the electronic component module 10C according to the fourth embodiment.

An electronic component module according to a fourth embodiment of the present disclosure will be described with reference to the drawings. FIG. 9A is a side cross-sectional view of an electronic component module 10C according to the fourth embodiment. FIG. 9B is a plan view illustrating a predetermined conductive portion of the electronic component module 10C according to the fourth embodiment. FIG. 9B is an enlarged view of a part where the predetermined conductive portion is formed.

As illustrated in FIGS. 9A and 9B, the electronic component module 10C according to the fourth embodiment is different from the electronic component module 10 according to the first embodiment in including a conductive portion 810 and a conductor pattern 80. The remaining configuration of the electronic component module 10C is the same as that of the electronic component module 10, and description of the same parts will be omitted.

The electronic component module 10C includes an electronic component 31C1. A conductive auxiliary layer 40C1 is formed in a top surface of the electronic component 31C1. The conductive auxiliary layer 40C1 is arranged so as to overlap a part of a second external electrode 312C1 and a part of the housing of the electronic component 31C1.

The electronic component module 10C includes the conductive portion 810 and the conductor pattern 80. The conductive portion 810 is formed in the recessed portion of the sealing resin 50. The recessed portion overlaps a conductive auxiliary layer 40C1. The conductive portion 810 is connected to the conductor pattern 80 and is connected to the conductive auxiliary layer 40C1.

The conductor pattern 80 is formed on the top surface 501 of the sealing resin 50. The conductor pattern 80 is physically separated from the conductive film 60 via a conductor non-forming portion 89.

The conductor pattern 80 has a predetermined length. The length of the conductor pattern 80 is determined according to a frequency (wavelength) of a high-frequency signal to be transmitted, received, or transmitted and received by the electronic component module 10C. In other words, the conductor pattern 80 functions as an antenna for a high-frequency signal to be transmitted, received, or transmitted and received by the electronic component module 10C. In other words, the conductor pattern 80 is a functional element formed in the electronic component module 10C. The conductor pattern 80 is connected to the conductive portion 810. Various shapes that enables functioning as an antenna can be applied to the conductor pattern 80. For example, the conductor pattern 80 is a spiral, meanders, a dipole, or the like.

As described above, in the electronic component module 10C, the conductor pattern 80 functioning as an antenna formed in a part of the electronic component module 10C and the electronic component 31C1 are connected via the conductive portion 810. As a result, the conductor pattern 80 and the electronic component 31C1 are connected with low resistance.

Note that the above-described configurations of the respective embodiments can be appropriately combined to exhibit actions and effects according to the combinations.

10, 10A, 10B, 10B1, 10B2, 10C electronic component module
20, 20B1, 20B2 substrate
22 land electrode
23 terminal electrode
24 conductor pattern
31, 31B1, 31B2, 31B3, 31C1, 32, 32B electronic component
40, 40B1, 40B2, 40C1 conductive auxiliary layer
50, 50B1, 50B2 sealing resin
51 recessed portion
60, 60B1, 60B2 conductive film
70 insulating auxiliary layer
80 conductor pattern
89 conductor non-forming portion
201 main surface
310 housing
311, 311B1, 311B2 first external electrode
312, 312B1, 312B2, 312C1 second external electrode
391, 392 conductive bonding material
600B1, 600B2, 600B3, 600B4, 600B5, 600B6 conductor pattern
610, 610B1, 610B2, 610B3, 610B4, 610B5, 610B6 conductive portion
691, 692 conductor non-forming portion
810 conductive portion
2111, 2112 land electrode

The invention claimed is:

1. An electronic component module comprising:
   a substrate having a first main surface;
   an electronic component including a housing having an outer surface with an insulation property, at least a first external electrode arranged on the outer surface of the housing, and a second external electrode, the electronic component being mounted on the first main surface of the substrate;
   a sealing resin having an insulation property and covering the electronic component and the first main surface side of the substrate;
   a conductive film covering an outer surface of the sealing resin; and
   a conductive auxiliary layer provided on a side of the electronic component opposite to the substrate in a normal direction of the first main surface, and covering a part of the first external electrode and being not connected to the second external electrode, wherein:
   the sealing resin has a recessed portion exposing the conductive auxiliary layer,
   the conductive film has a conductive portion provided in the recessed portion, the conductive portion being connected to the conductive auxiliary layer,
   the housing has a top surface and a side surface orthogonal to the top surface, and
   the conductive auxiliary layer is positioned so as to go around the side surface of the housing from the top surface.

2. The electronic component module according to claim 1, wherein the conductive auxiliary layer is provided to be wider than the first external electrode and the housing.

3. The electronic component module according to claim 1, wherein the conductive auxiliary layer covers an outer edge of a side surface of the recessed portion.

4. The electronic component module according to claim 1, further comprising:

an insulating auxiliary layer provided on the side of the electronic component opposite to the substrate in the normal direction of the first main surface, and covering a part of the housing and a part of the second external electrode.

5. The electronic component module according to claim 1, wherein the conductive film is connected to a grounding conductor of the substrate.

6. The electronic component module according to claim 1, wherein a part of the conductive film connected to the conductive auxiliary layer is a wiring electrode to another electronic component module.

7. The electronic component module according to claim 1, wherein a part of the conductive film connected to the conductive auxiliary layer is a functional element of the electronic component module.

8. The electronic component module according to claim 2, wherein the conductive auxiliary layer covers an outer edge of a side surface of the recessed portion.

9. The electronic component module according to claim 2, further comprising:
an insulating auxiliary layer provided on the side of the electronic component opposite to the substrate in the normal direction of the first main surface, and covering a part of the housing and a part of the second external electrode.

10. The electronic component module according to claim 3, further comprising:
an insulating auxiliary layer provided on the side of the electronic component opposite to the substrate in the normal direction of the first main surface, and covering a part of the housing and a part of the second external electrode.

11. The electronic component module according to claim 4, wherein in plan view of the electronic component, the conductive auxiliary layer overlaps the insulating auxiliary layer on a side of the insulating auxiliary layer opposite to the electronic component in the normal direction of the first main surface.

12. The electronic component module according to claim 4, wherein in plan view of the electronic component, a bottom of the recessed portion does not overlap the insulating auxiliary layer.

13. The electronic component module according to claim 7, wherein the functional element is an antenna.

14. The electronic component module according to claim 11, wherein in plan view of the electronic component, a bottom of the recessed portion does not overlap the insulating auxiliary layer.

15. A method of manufacturing an electronic component module comprising:
a step of mounting an electronic component on a substrate;
a step of forming a conductive auxiliary layer on a surface of a first external electrode of the electronic component on a side opposite to the substrate side;
a step of covering a mounting surface side of the electronic component on the substrate with a sealing resin having an insulation property;
a step of forming a recessed portion exposing the conductive auxiliary layer from the sealing resin; and
a step of forming a conductive film covering an outer surface of the sealing resin including the recessed portion, wherein:
the electronic component includes a housing having an outer surface with an insulation property,
the housing has a top surface and a side surface orthogonal to the top surface, and
the conductive auxiliary layer is formed so as to go around the side surface from the top surface.

16. The method of manufacturing an electronic component module according to claim 15, further comprising a step of forming an insulating auxiliary layer on a surface of a second external electrode of the electronic component opposite to the substrate side before forming the conductive auxiliary layer.

* * * * *